(12) United States Patent
Rofougaran

(10) Patent No.: US 8,326,253 B2
(45) Date of Patent: *Dec. 4, 2012

(54) METHOD AND SYSTEM FOR POWER AMPLIFIER (PA) WITH ON-PACKAGE MATCHING TRANSFORMER

(75) Inventor: Ahmadreza Rofougaran, Newport Coast, CA (US)

(73) Assignee: Broadcom Corporation, Irvine, CA (US)

(*) Notice: Subject to any disclaimer, the term of this patent is extended or adjusted under 35 U.S.C. 154(b) by 265 days.

This patent is subject to a terminal disclaimer.

(21) Appl. No.: 12/787,963

(22) Filed: May 26, 2010

(65) Prior Publication Data

US 2010/0231303 A1    Sep. 16, 2010

Related U.S. Application Data

(63) Continuation of application No. 11/678,790, filed on Feb. 26, 2007, now Pat. No. 7,729,683.

(51) Int. Cl.
*H04B 1/16* (2006.01)

(52) U.S. Cl. ...................... 455/341; 455/127.1; 455/522

(58) Field of Classification Search .... 455/127.1–127.3, 455/341, 343.1, 522
See application file for complete search history.

(56) References Cited

U.S. PATENT DOCUMENTS

| | | | | |
|---|---|---|---|---|
| 6,809,581 | B2* | 10/2004 | Rofougaran et al. | 327/563 |
| 7,616,941 | B2* | 11/2009 | Rofougaran | 455/341 |
| 7,729,683 | B2* | 6/2010 | Rofougaran | 455/341 |
| 2005/0043007 | A1* | 2/2005 | Rofougaran et al. | 455/333 |
| 2008/0164941 | A1* | 7/2008 | Lee et al. | 330/124 R |
| 2010/0052794 | A1* | 3/2010 | Rofougaran | 330/296 |

* cited by examiner

*Primary Examiner* — Christian Hannon
(74) *Attorney, Agent, or Firm* — Farjami & Farjami LLP

(57) ABSTRACT

Aspects of a system for a power amplifier with an on-package matching transformer may include a DC/DC converter that enables generation of a bias voltage level within an IC die based on an amplitude of an input signal to a PA circuit within the IC die. The bias voltage level may be applied to a transformer, which is external to the IC die but internal to an IC package containing the IC die and/or a circuit board containing the IC package. One or more amplifier bias voltage levels, derived from the bias voltage level applied to the transformer, may be applied to the PA circuit.

20 Claims, 4 Drawing Sheets

METHOD AND SYSTEM FOR POWER AMPLIFIER (PA) WITH ON-PACKAGE MATCHING TRANSFORMER

CROSS-REFERENCE TO RELATED APPLICATIONS/INCORPORATION BY REFERENCE

This application is a continuation of U.S. application Ser. No. 11/678,790 filed Feb. 26, 2007.

FIELD OF THE INVENTION

Certain embodiments of the invention relate to communication networks. More specifically, certain embodiments of the invention relate to a method and system for a power amplifier (PA) chip with a matching transformer in the surrounding package.

BACKGROUND OF THE INVENTION

A power amplifier (PA) circuit may be biased for different modes, or "classes" of operation. Exemplary classes include Class A, Class AB, and Class B. In Class A operation, a PA may be biased such that the PA is in a conducting, or ON, state during 100% of the cycle, or the entire cycle, of the input signal. The bias level is also typically selected such that the PA operates in the most linear portion of the transfer curve, which characterizes the PA circuit. In Class A operation, the output signal from the PA is typically a scaled version of the input signal, where the scaling factor is a function of the gain associated with the PA circuit. However, because of the bias level utilized for Class A operation, the PA is typically in a conducting state even when there is no input signal. Furthermore, even when the PA is amplifying an input signal, the efficiency of the PA may not exceed 50%. For example, each watt of delivered output power, or $P_{out}$, may require two (2) watts of delivered power, $P_{DC}$, from a DC power supply source (such as a battery). One limitation of conventional Class A PA circuits for use in mobile wireless communication systems like wireless local area network (WLAN) systems is that high bias levels often utilized to enable large variations in output power levels may result in unacceptably short battery life and/or high levels of generated thermal heat.

In Class B operation, a PA may be biased such that the PA is in a conducting state during 50%, or half, of the cycle of the input signal. This may result in large amounts of distortion of the input signal in the output signal. In this regard, in Class B operation, the PA may operate in a nonlinear portion of the transfer curve. However, the theoretical efficiency of a Class B PA circuit may reach 78.5%. The higher efficiency of the Class B PA results from the PA being in a non-conducting, or OFF, state half of the time. While the PA is in the OFF state, power dissipation may be theoretically zero (0). One limitation of Class B PA circuits is that distortion levels in output signals may be unacceptably high.

In Class AB operation, a PA may be biased such that the PA is in a conducting state for greater than 50%, but less than 100%, of the cycle of the input signal. In Class AB operation, the PA may be more efficient than in Class A operation, but less efficient than in Class B operation. Furthermore, in Class AB operation, the PA may produce more distortion than in Class A operation, but less than in Class B operation.

In Class C operation, a PA may be biased such that the PA is in a conducting state for less than 50% of the cycle of the input signal. While Class C amplifiers may produce more distortion than Class A, Class AB, or Class B amplifiers, the theoretical efficiency of a Class C amplifier may reach 90%. The Class C amplifier may receive an input signal and generate a series of current pulse signals. The current pulse signals generated by the Class C amplifier may comprise undesired frequency components. The output signal from the Class C amplifier may be input to a tuned circuit, which may comprise circuitry to suppress unwanted frequency components. The resulting output signal from the tuned circuit may be a signal for which that comprises frequencies within a desired frequency band, for example such as a frequency band utilized in global system for mobile (GSM) communications systems.

While the operating class of a PA provides one measure of efficiency, another measure of efficiency is determined by how efficiently the output power from the PA, $P_{out}$, is delivered to a load. For purposes of the present application, this measure of efficiency may be referred to as load transfer efficiency. In a wireless communications system, an exemplary load may comprise an antenna. The PA may deliver the output power to the load most efficiently when the output impedance of the PA is equal to the impedance of the load. In this regard, the PA and the load may be referred to as being "impedance matched".

Many conventional PA circuits are implemented in integrated circuit (IC) devices, or chips. The IC may comprise a die, which may comprise active and/or passive circuitry, and a package, which may comprise a plurality of pins, or contacts, which enable electrical conductivity between various contact points on the die, and various contact points on a board, or other electronic assembly on which the IC is installed.

Some conventional PA integrated circuit chips achieve impedance matching by insertion of an on-chip transformer between the output of the PA and a load, which is located off-chip. A transformer utilized for impedance matching may be referred to as a matching transformer. Because of limitations in on-chip transformer circuits, signal energy may be lost when coupling a signal from the primary windings of the on-chip transformer to the secondary windings of the on-chip transformer. The result may be a reduced level of delivered power to the load, $P_{load}$.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for a power amplifier (PA) chip with a matching transformer in the surrounding package, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a power amplifier (PA) chip with a matching transformer in the surrounding package. Various embodiments of the invention may improve PA efficiency, and load transfer efficiency. PA efficiency may be improved by dynamically changing the $P_{DC}$ bias level in response to dynamic changes in the amplitude of the input signal applied to the PA. In various embodiments of the invention, load transfer efficiency may be improved by implementing the PA circuit in an IC die, while implementing the matching transformer in the IC package surrounding the die. By placing the matching transformer in the IC package, materials may be utilized with higher permeability, and lower parasitic resistance and/or capacitance values. The result may be a transformer, for which less signal energy may be lost which coupling a signal from the primary transformer winding to the secondary transformer winding. The dynamically changed $P_{DC}$ bias level may be applied to the matching transformer, which may in turn enable dynamic biasing of the PA circuit. In various alternative embodiments of the invention, the matching transformer may be located in a board on which the IC may be installed.

Figure 1:
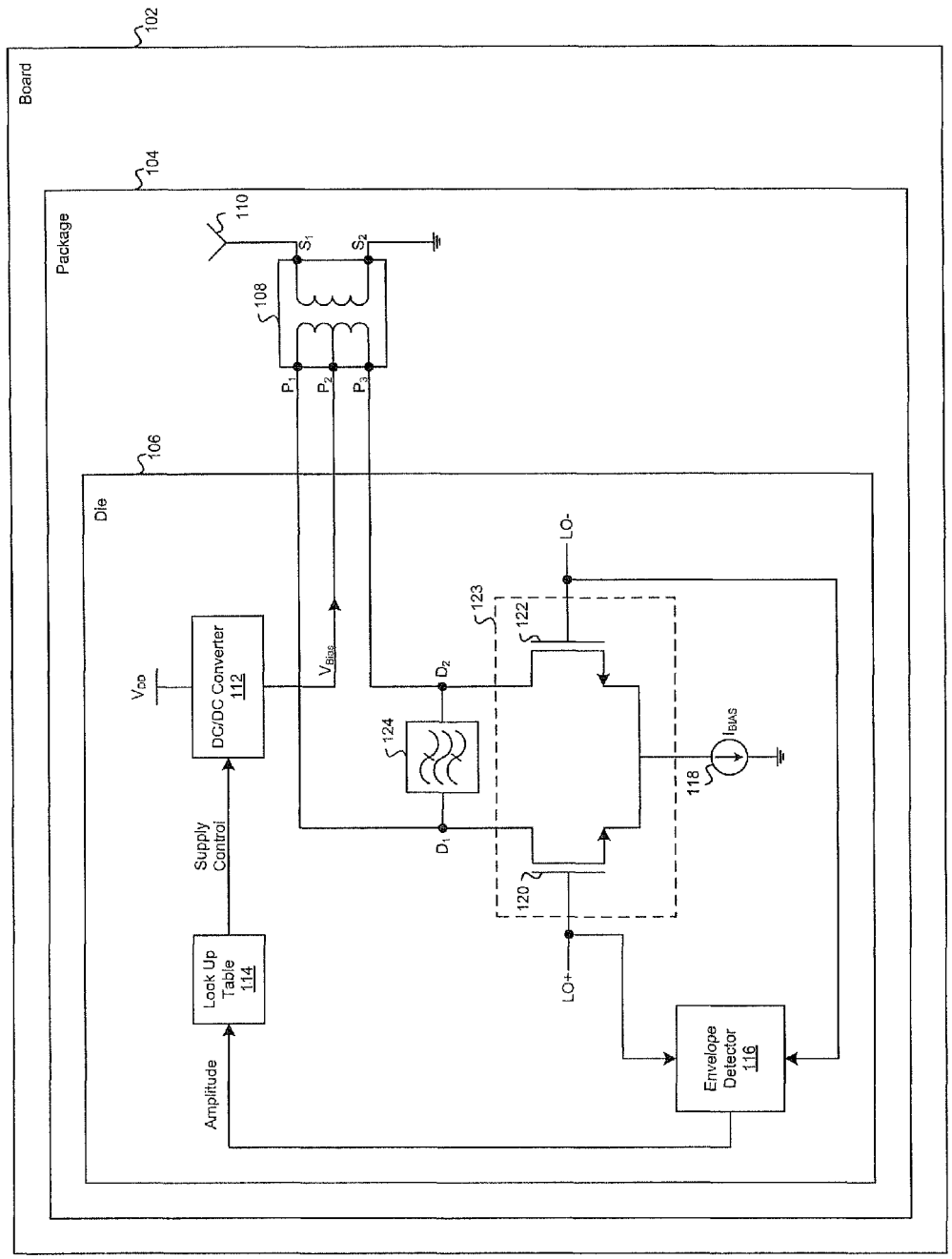
FIG. 1 is a diagram of a power amplifier with dynamic biasing, on-package matching transformer, and on-die filter, in accordance with an embodiment of the invention.

FIG. 1 is a diagram of a power amplifier with dynamic biasing, on-package matching transformer, and on-die filter, in accordance with an embodiment of the invention. Referring to FIG. 1, there is shown a board 102. The board 102 may comprise an IC package 104. The IC package 104 may comprise a die 106, a matching transformer 108, and an antenna 110. The die 106 may comprise a DC to DC (DC/DC) converter 112, a look up table (LUT) 114, an envelope detector 116, a current source 118, transistors 120 and 122, and a filter 124. In an exemplary embodiment of the invention, the transistors 120 and 122 may be fabricated by utilizing CMOS technology.

The package 104 may comprise a plurality of pins, or other contact points, each of which may enable electrical conductivity from a contact point on the die 106, to a contact point on the board 102. The package 104 may utilize any of a variety of technologies for enclosing a die 106.

Within in the die 106 the DC/DC converter 112 may comprise suitable logic, circuitry and/or code that may enable conversion of an input supply voltage, $V_{DD}$, to a bias voltage, $V_{Bias}$, based on an input control signal, Supply Control. The voltage level for the bias voltage $V_{Bias}$ may be less than or equal to the voltage level of the input supply voltage $V_{DD}$. In an exemplary embodiment of the invention, the DC/DC converter 112 may comprise a switching regulator circuit.

The envelope detector 116 may comprise suitable logic, circuitry and/or code that may enable detection of an amplitude of a time varying input signal, labeled as the differential signal LO+ and LO− in FIG. 1. Based on the detected amplitude of the input signal, the envelope detector 116 may enable representation of the detected input signal amplitude in a generated output signal labeled Amplitude in FIG. 1. In various embodiments of the invention, the signal Amplitude may be an analog signal and/or a digital signal.

The LUT 114 may comprise suitable logic, circuitry and/or code that may enable generation of a Supply Control code word based on an input Amplitude signal. In an exemplary embodiment of the invention, the LUT 114 may comprise one or more memory circuits that utilize the Amplitude signal to generate an address to access a memory location. Based on the binary data retrieved from the address memory location, the Supply Control code word may be generated.

The current source 118 may comprise suitable logic, circuitry and/or code that may enable generation of a current, $I_{Bias}$.

The transistors 120 and 122 may form a differential power amplifier (PA) circuit 123 that receives a differential input signal, labeled LO+ and LO−, and generated an amplified output signal at the nodes labeled $D_1$ and $D_2$. The input LO+ may be applied to the gate of the transistor 120, and the input LO− may be applied to the gate of the transistor 122. The node $D_1$ may be coupled to the drain of the transistor 120, and the node $D_2$ may be coupled to the drain of the transistor 122.

The filter 124 may comprise suitable logic, circuitry and/or code that may suppress signals within one or more specified frequency ranges. In an exemplary embodiment of the invention, the filter 124 may comprise a bandpass filter that may suppress frequency components in the differential signal at the nodes $D_1$ and $D_2$, which are outside of a pass band for the filter 124.

The matching transformer 108 may comprise primary windings labeled $R_1$, $P_2$ and $P_3$ in FIG. 1, and secondary windings labeled $S_1$ and $S_2$. The primary and secondary windings may comprise electrically conducting material, such as wire manufactured from a suitable metal or conductor, and a core manufactured from a suitable magnetically permeable material. The location of the matching transformer 108 in the package 104 may enable the utilization of materials, which may not be utilized for the manufacture of matching transformers, which are located on a die. In addition, the location of the matching transformer 108 in the package 104 may enable the realization of physical dimensions, which may not be achievable for matching transformers, which are located on a die. The combination of wider material choice, and wider choice of physical dimension, may enable more efficient transfer of signal energy from the primary windings to the secondary windings in the matching transformer 108, than may be achievable with matching transformers, which are located on a die.

In an exemplary embodiment of the invention, the package 104 may be a flip chip package, containing the matching transformer 108 and antenna 110, to which the die 106 may be bonded. A contact point for the drain of transistor 120, labeled $D_1$ in FIG. 1, may be coupled to a contact point for the primary winding of the matching transformer 108, labeled $P_1$ in FIG. 1. A contact point for the drain of transistor 122, labeled $D_2$ in FIG. 1, may be coupled to a contact point for the primary winding of the matching transformer 108, labeled $P_3$ in FIG. 1. A contact point for the output of the DC/DC converter 112 may be coupled to a contact point for the primary winding of the matching transformer 108, labeled $P_2$ in FIG. 1. A contact point for the secondary winding of the matching transformer 108, labeled $S_1$ in FIG. 1, may be coupled to the antenna 110. A contact point for the secondary winding of the matching transformer 108, labeled $S_2$ in FIG. 1, may be coupled to ground.

In operation, a dynamic bias level for the PA 123 may be determined based on a differential input signal LO+ and LO−, which may be applied to the gates of transistors 120 and 122, respectively. The amplitude of the differential input signal may be detected by the envelope detector 116. The envelope detector 116 may represent the detected differential input signal amplitude via the signal, Amplitude. The LUT 114 may generate a Supply Control signal based on the Amplitude signal. The DC/DC converter 112 may convert the supply voltage $V_{DD}$ to a bias voltage $V_{Bias}$ based on the Supply Control signal. The bias voltage may be applied to the matching transformer 108 at the point labeled $P_2$. In response, the bias voltage may be applied to the drain of the transistor 120, via the contact point $D_1$, and the drain of the transistor 122, via the contact point $D_2$. The bias voltage applied at the contact point $D_1$ may provide a bias voltage to the transistor 120 while the bias voltage applied at the contact point $D_2$ may provide a bias voltage to the transistor 122.

In various embodiments of the invention, the LUT 114 may enable the PA 123 to operate in various classes. For example, the LUT 114 may enable the dynamic selection of bias levels $V_{Bias}$, which enable the transistors 120 and 122 to operate in the linear portion of the respective transfer curves for the given amplitude of the differential input signal LO+ and LO−, such as in a Class A amplifier. The dynamic biasing method, however, may enable the PA 123 to operate with increased efficiency compared to conventional Class A amplifier designs because the bias level, and power consumption of the PA 123, may be increased and/or decreased in response to the amplitude of the differential input signal. Alternatively, the LUT 114 may enable the dynamic selection of bias levels, which enable the PA 123 to operate as a Class B amplifier, a Class AB amplifier, or a Class C amplifier, for example.

The output voltage from the PA 123, $V_{out}$, may be measured between the nodes $D_1$ and $D_2$. The corresponding output current, as supplied via the DC/DC converter 112, may be $I_{Bias}$. The output power from the PA 123, $P_{out}$, may be proportional to the multiplicative product $V_{out} \cdot I_{Bias}$. The matching transformer 108 may transfer the output power from the PA 123, $P_{out}$, measured at the primary windings between nodes $P_1$ and $P_2$, and transfer at least a portion of $P_{out}$, $P_{load}$, to the secondary windings as measured between the nodes $S_1$ and $S_2$. The portion of power which may be transferred from the primary windings to the secondary windings depends upon signal energy loss between the primary windings and secondary windings of the matching transformer 108, $P_{loss}$, as shown in the following equation:

$$P_{load} = P_{out} - P_{loss} \quad [1]$$

In various embodiments of the invention, the matching transformer 108 may be located within the package 104 as opposed to being located within the die 106. Locating the matching transformer 108 external to the die 106 may enable implementation of more efficient matching transformer designs for which signal energy loss may be lower in comparison to some conventional IC designs in which the PA 123 and matching transformer are located within an IC die. The matching transformer 108 may realize the higher efficiency by utilizing high permeability core materials and/or low resistance, low parasitic parameter materials for the primary and secondary windings. In various embodiments of the invention $P_{load} \approx P_{out}$.

The voltage $V_{out}$ may induce a proportional voltage, $V_A$, across the secondary windings of the matching transformer as measured at nodes $S_1$ and $S_2$ respectively. The voltage $V_A$ may correspond to a voltage applied to the antenna 110. The antenna 110 may correspond to a load impedance, $R_L$. Similarly, the current $I_{Bias}$ may induce a proportional current, $I_{load}$, through the load impedance $R_L$. Consequently, the voltage $V_A$ may be proportional to the current $I_{Bias}$, while the power transferred to the antenna, $P_{load}$, may be proportional to $I_{Bias}^2$.

Changes in the voltage level for $V_{out}$ may result in corresponding changes in the current level for $I_{Bias}$. In turn, this may result in corresponding changes in the voltage level for $V_A$. For some IC fabrication technologies, such as CMOS, the impedance of the transistors 120 and 122 may be relatively small (as measured in ohms). In addition, the technology may require that changes, or swings, in the voltage levels for $V_{out}$ be limited. By contrast, the impedance of the antenna 110, may be considerably larger, for example $R_L$=50 ohms. By utilizing the matching transformer 108 to provide impedance matching between the impedance of the PA 123, as measured between the nodes $D_1$ and $D_2$, and the impedance of the antenna 110, $R_L$, voltage level swings in $V_{out}$ may be limited.

Figure 2:
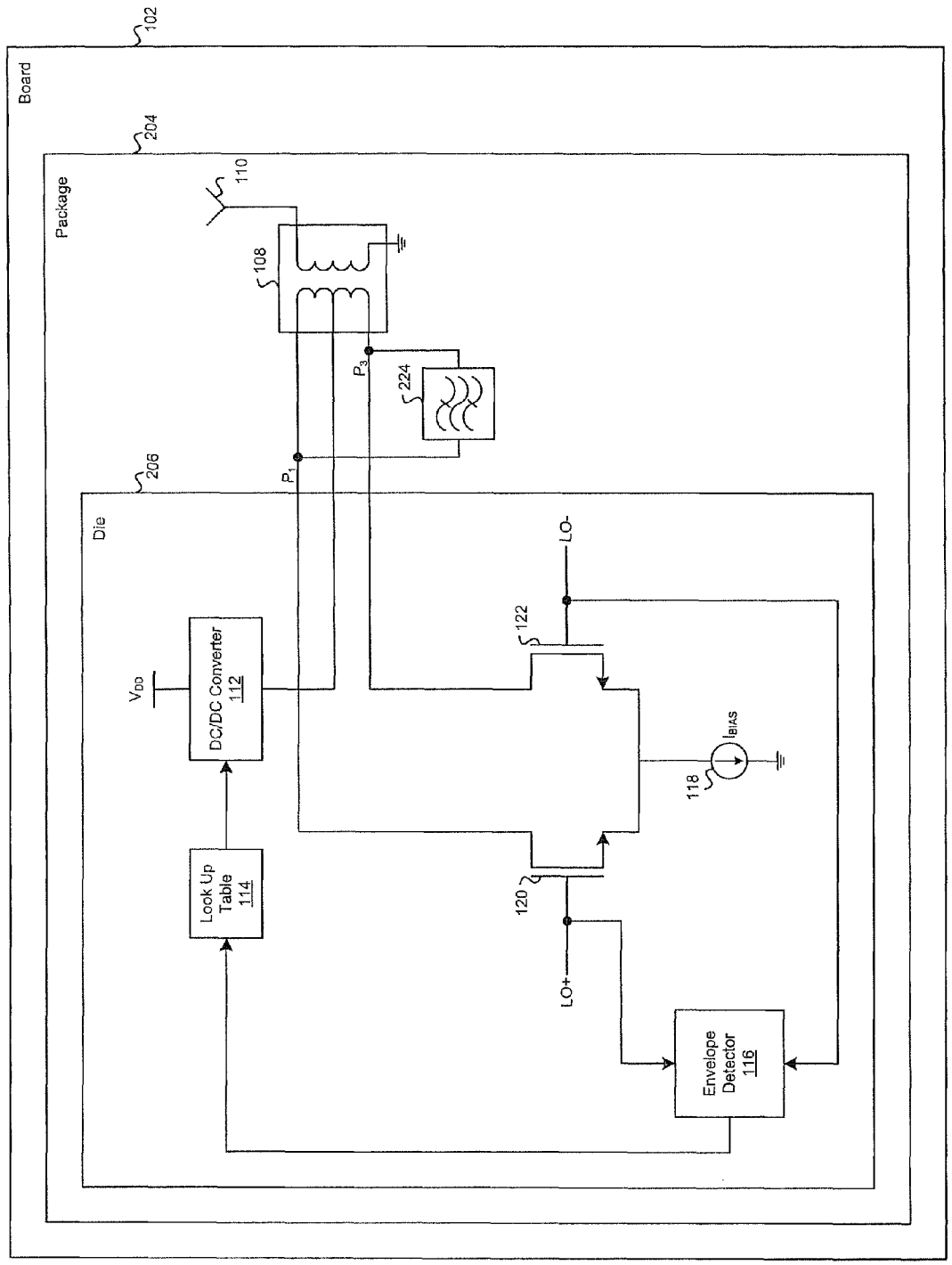
FIG. 2 is a diagram of a power amplifier with dynamic biasing, on-package matching transformer, and on-package filter, in accordance with an embodiment of the invention.

FIG. 2 is a diagram of a power amplifier with dynamic biasing, on-package matching transformer, and on-package filter, in accordance with an embodiment of the invention. Referring to FIG. 2, there is shown a board 102. The board 102 may comprise an IC package 204. The IC package 204 may comprise a die 206, a matching transformer 108, a filter 224, and an antenna 110. The die 206 may comprise a DC to DC (DC/DC) converter 112, a look up table (LUT) 114, an envelope detector 116, a current source 118, and transistors 120 and 122.

FIG. 2 differs from FIG. 1 in that FIG. 2 shows an exemplary embodiment of the invention in which the on-die filter 124 from FIG. 1 is replaced by an on-package filter 224 in FIG. 2. The on-package filter 224 is coupled to the nodes $P_1$ and $P_2$ as is the on-die filter 124 in FIG. 1. The function and operation of the on-package filter 224 may be substantially similar to the on-die filter 124.

Figure 3:
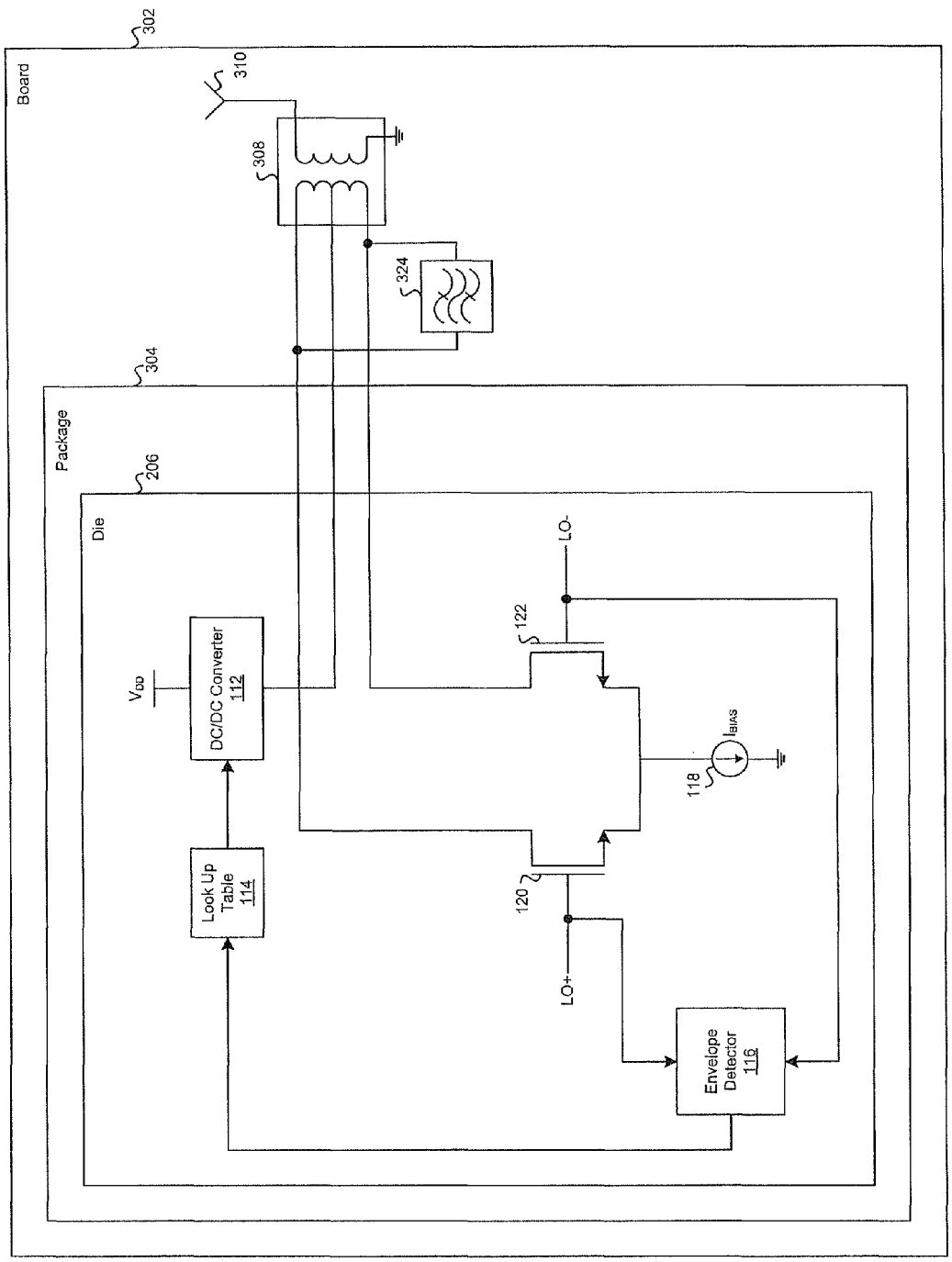
FIG. 3 is a diagram of a power amplifier with dynamic biasing, on-board matching transformer, and on-board filter, in accordance with an embodiment of the invention.

FIG. 3 is a diagram of a power amplifier with dynamic biasing, on-board matching transformer, and on-board filter, in accordance with an embodiment of the invention. Referring to FIG. 3, there is shown a board 302. The board 302 may comprise an IC package 304. The IC package 304 may comprise a die 206, a matching transformer 308, a filter 324, and an antenna 310. The die 206 may comprise a DC to DC (DC/DC) converter 112, a look up table (LUT) 114, an envelope detector 116, a current source 118, and transistors 120 and 122.

FIG. 3 differs from FIG. 3 in that FIG. 3 shows an exemplary embodiment of the invention in which the on-package filter 224 from FIG. 2 is replaced by an on-board filter 324 in FIG. 3, the on-package matching transformer 108 from FIG. 2 is replaced by an on-board matching transformer 308, and the on-package antenna 110 from FIG. 2 is replaced by an on-board antenna 310. The function and operation of the on-package filter 224 may be substantially similar to the on-die filter 124, the on-board matching transformer 308 is substantially similar to the on-package matching transformer 108, and the on-board antenna 310 is substantially similar to the on-package antenna 110.

Figure 4:
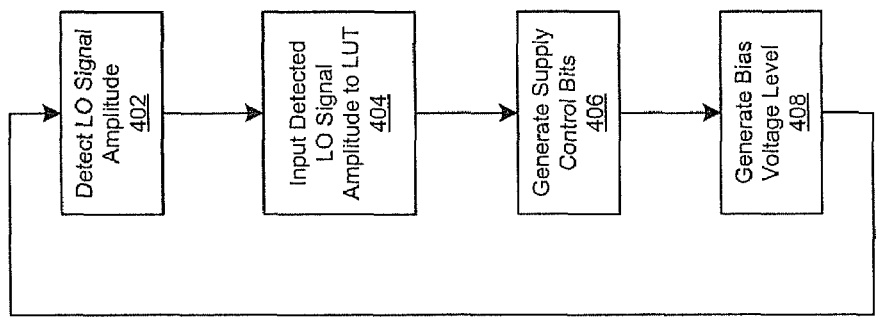
FIG. 4 is a flowchart illustrating exemplary steps for dynamic biasing of a PA, in accordance with an embodiment of the invention.

FIG. 4 is a flowchart illustrating exemplary steps for dynamic biasing of a PA, in accordance with an embodiment of the invention. Referring to FIG. 4, in step 402 the envelope detector 116 may detect the amplitude of the differential input signal to the PA 123. In step 404, the envelope detector 116 may send a signal to the LUT 114, which indicates the amplitude of the differential input signal. In step 406, the LUT 114 may generate supply control bits based on the input amplitude information received in step 404. In step 408, the DC/DC converter 112 may dynamically set a bias voltage level for $V_{Bias}$, based on the supply control bits received in step 406. The magnitude of the bias voltage level may be less than or equal to the magnitude of the supply voltage level $V_{DD}$.

In various embodiments of the invention, the bias voltage level may be continuously set dynamically during circuit operation in response to changes in the amplitude of the differential input signal to the PA 123. In this regard, step 402 may follow step 408.

Aspects of a system for a power amplifier with an on-package matching transformer may include a DC/DC converter 112 that enables generation of a bias voltage level within an IC die 106 based on an amplitude of an input signal to a PA circuit 123 within the IC die 106. The bias voltage level may be applied to a transformer 108, which is external to the IC die 106 but internal to an IC package 104 containing the IC die 106 and/or a circuit board 102 containing the IC package 104. One or more amplifier bias voltage levels, derived from the bias voltage level applied to the transformer 108, may be applied to the PA circuit 123. A subsequent bias voltage level may be dynamically generated based on a subsequent amplitude of the input signal to the PA circuit 123.

The generated bias voltage level may be selected based on a look up table 114. The look up table 114 may enable the PA circuit 123 to operate as a Class A amplifier, a Class B amplifier, a Class AB amplifier, and/or a Class C amplifier. The output signal from the PA circuit 123 may be applied to the primary windings of the transformer 108. The transformer 108 may enable generation of a secondary output signal at the secondary windings based on the output signal applied to the primary windings. The transformer 108 may enable matching of an output impedance from the PA circuit 123 measured at the primary windings to an impedance load measured at the secondary windings. The impedance load may comprise an antenna 110.

A filtering circuit 124 may be applied to the output signal from the PA circuit 123. The filtering circuit may be internal to the IC die 106, the IC package 104, and/or the circuit board 102. The filtering circuit 124 may be a bandpass filter.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for power amplification in a wireless communication system, the method comprising:

generating a bias voltage level within an integrated circuit (IC) die based on a power control signal;

applying said generated bias voltage level to a transformer external to said IC die but internal to one or both of an IC package containing said IC die and/or a circuit board containing said IC package;

generating one or more amplifier bias voltage levels based on said generated bias voltage level; and applying said one or more amplifier bias voltage levels to a power amplifier circuit that is located within said IC die.

2. The method according to claim 1, comprising generating said bias voltage level based on a detected amplitude level of an input signal to said power amplifier circuit.

3. The method according to claim 2, comprising generating an amplitude signal based on said detected amplitude level.

4. The method according to claim 3, comprising generating said power control signal based on said generated amplitude signal.

5. The method according to claim 3, comprising selecting said power control signal from a look up table based on said generated amplitude signal.

6. The method according to claim 1, comprising selecting an amplifier operating mode for said power amplifier circuit from a group of candidate amplifier operating modes.

7. The method according to claim 6, wherein said group of candidate amplifier operating modes comprises one or more of Class A, Class B, Class AB and/or Class C.

8. The method according to claim 6, comprising selecting said one or more amplifier bias voltage levels based on said selected amplifier operating mode.

9. The method according to claim 1, comprising generating said one or more amplifier bias voltage levels via said transformer.

10. The method according to claim 1, comprising generation one or more amplifier bias current levels based on said one or more amplifier bias voltage levels.

11. A system for power amplification in a wireless communication system, the system comprising:

one or more circuits that enable generation of a bias voltage level within an integrated circuit (IC) die based on a power control signal;

said one or more circuits enable application of said generated bias voltage level to a transformer external to said IC die but internal to one or both of an IC package containing said IC die and/or a circuit board containing said IC package;

said one or more circuits enable generation of one or more amplifier bias voltage levels based on said generated bias voltage level; and said one or more circuits enable application of said one or more amplifier bias voltage levels to a power amplifier circuit that is located within said IC die.

12. The system according to claim 11, wherein said one or more circuits enable generation of said bias voltage level based on a detected amplitude level of an input signal to said power amplifier circuit.

13. The system according to claim 12, wherein said one or more circuits enable generation of an amplitude signal based on said detected amplitude level.

14. The system according to claim 13, wherein said one or more circuits enable generation of said power control signal based on said generated amplitude signal.

15. The system according to claim 13, wherein said one or more circuits enable selection of said power control signal from a look up table based on said generated amplitude signal.

16. The system according to claim 11, wherein said one or more circuits enable selection of an amplifier operating mode for said power amplifier circuit from a group of candidate amplifier operating modes.

17. The system according to claim 16, wherein said group of candidate amplifier operating modes comprises one or more of Class A, Class B, Class AB and/or Class C.

18. The system according to claim 16, wherein said one or more circuits enable selection of said one or more amplifier bias voltage levels based on said selected amplifier operating mode.

19. The system according to claim 11, wherein said one or more circuits enable generation of said one or more amplifier bias voltage levels via said transformer.

20. The system according to claim 11, wherein said one or more circuits enable generation of one or more amplifier bias current levels based on said one or more amplifier bias voltage levels.

* * * * *